United States Patent [19]

Dalal et al.

[11] 4,410,622

[45] Oct. 18, 1983

[54] FORMING INTERCONNECTIONS FOR MULTILEVEL INTERCONNECTION METALLURGY SYSTEMS

[75] Inventors: Hormazdyzr D. Dalal; Bisweswar Patnaik, both of Wappingers Falls; Homi G. Sarkary, Hopewell Junction, all of N.Y.

[73] Assignee: International Business Machines Corporation, Armonk, N.Y.

[21] Appl. No.: 442,534

[22] Filed: Nov. 18, 1982

Related U.S. Application Data

[63] Continuation of Ser. No. 179,209, Aug. 18, 1980, abandoned, which is a continuation of Ser. No. 974,572, Dec. 29, 1978, abandoned.

[51] Int. Cl.³ .............................................. B05D 3/06
[52] U.S. Cl. ................................... 430/312; 430/318; 430/323; 156/646; 156/659.1; 156/661.1; 156/664; 156/665; 156/666; 156/668; 204/192 D
[58] Field of Search .................. 430/312, 318, 323; 427/96; 156/646, 659.1, 661.1, 664, 665, 666, 668; 204/192 D

[56] References Cited

U.S. PATENT DOCUMENTS

| | | | |
|---|---|---|---|
| 3,801,880 | 4/1974 | Harada et al. | 427/96 |
| 3,923,568 | 12/1975 | Bersin | 156/646 |
| 3,951,709 | 4/1976 | Jacob | 156/646 |
| 3,985,597 | 10/1976 | Zielinski | 156/646 |
| 3,994,793 | 11/1976 | Harvilchuck et al. | 156/646 |
| 4,004,044 | 1/1977 | Franco et al. | 427/43 |
| 4,007,103 | 2/1977 | Baker et al. | 204/192 D |
| 4,092,442 | 5/1978 | Agnihorti et al. | 430/318 |
| 4,121,240 | 10/1978 | Katto | 204/192 D |
| 4,172,004 | 10/1979 | Alcorn | 156/646 |

OTHER PUBLICATIONS

IBM Tech. Dis. Bul., Esch et al., vol. 9, No. 1, Jun. 1966, p. 6.
IBM Tech. Dis. Bul., Patel, vol. 20, No. 6, Nov. 1977, p. 2201.

*Primary Examiner*—Michael R. Lusignan
*Assistant Examiner*—Richard Bueker
*Attorney, Agent, or Firm*—T. Rao Coca

[57] ABSTRACT

A method for forming feedthrough connections, or via studs, between levels of metallization which are typically formed atop semiconductor substrates. A conductive pattern is formed which includes the first level metallurgy, an etch barrier and the feedthrough metallurgy in the desired first level metallurgical configuration. The via stud metallurgy alone is then patterned, preferably by reactive ion etching, using the etch barrier to prevent etching of the first level metallurgy. An insulator is then deposited around the via studs to form a planar layer of studs and insulator, after which a second level of metallization may be deposited.

9 Claims, 13 Drawing Figures

FORMING INTERCONNECTIONS FOR MULTILEVEL INTERCONNECTION METALLURGY SYSTEMS

This is a continuation of application Ser. No. 179,209 filed Aug. 18, 1980, now abandoned, which was a continuation of application Ser. No. 974,572 filed Dec. 29, 1978, now abandoned.

BACKGROUND OF THE INVENTION

1. Field of the Invention

This invention relates to the fabrication of metallurgy atop substrates. More particularly, it relates to interconnection systems for metallurgy disposed atop semiconductor devices.

2. Description of the Prior Art

The continuing improvements in semiconductor integrated circuit technology have resulted in the capability of forming increased numbers of transistors, resistors, etc., within a given semiconductor chip. For example, ion implantation has allowed the devices to be smaller, and improved masking and isolation techniques have allowed the devices to be more closely spaced. This miniaturization has resulted in decreased costs and improved performance in integrated circuits. Unfortunately, many of the devices formed within the semiconductor must remain unused in the completed chip because of space required for wiring the circuits together.

For example, a practical state-of-the-art integrated circuit chip, containing between 700 to 2,000 circuits, typically utilizes less than 50 percent of the available circuits. The principal reason for this is the space which the wiring takes up on the surface of the chip. This interconnection metallurgy system atop the chip is extremely complex and the spacing between the wires is very tight. To achieve even a 50 percent efficiency of circuit utilization, at least two or three and possibly four separate levels of complex conductive patterns, each separated by one or more layers of dielectric material, are used.

Ordinarily, the first level conductive pattern on the chip surface interconnects the devices within the chips into circuits and also provides circuit-to-circuit interconnections. The second level conductive pattern conventionally completes the circuit-to-circuit connections and contains a portion of the power buses. The third level may be used for power and I/O connections to a support, such as a module, substrate or card. To interconnect each of these levels of metallization, it is necessary to form feedthrough conductive connections, otherwise known as via studs, within the dielectric layers separating the metallization. The most common technique used today is to etch the dielectric layer atop one level of metallurgy to form feedthrough holes and then deposit the second metallurgy layer over the dielectric layer and into the via holes to contact the first metallurgy layer. However, overetching of one dielectric layer due to mask misalignment, for example, may result in the etching of a lower dielectric layer. It has been necessary to provide increased areas of metallurgy at the via hole sites to prevent the overetching; however, this technique also substantially increases the chip area required for the interconnection metallurgy.

One technique for solving this problem is found in U.S. Pat. No. 3,844,831, issued in the names of E. E. Cass et al, assigned to the same assignee as the present invention. This technique involves the use of dielectric layers with dissimilar etching characteristics, whereby an etchant which attacks one type of dielectric does not substantially affect the other. Although the Cass et al invention has been successful, dielectric etching per se is recognized as causing shorts, pinholes and contamination, no matter how controlled the process.

It would be more desirable to form interconnections between levels of metallurgy without the necessity of etching in the dielectric layers.

One technique for doing so is described in U.S. Pat. No. 4,029,562, issued in the names of B. C. Feng et al, and assigned to the same assignee as the present invention. The Feng et al process involves the depositing of the feedthrough pattern which includes a conventional functional metal and a cap of expendable material atop the conductive film pattern, say the first level of metallization. The expendable material can be removed by an etchant which does not attack the conductive film. The insulator is then deposited atop the first level film as well as the feedthrough pattern by RF sputtering at a bias which is sufficiently high to cause substantial reemission of the insulator. This covers the exposed substrate and thin film surfaces, as well as the expendable material, with the insulator but leaves the side surfaces of the expendable material exposed. The expendable material may then be chemically etched, so as to leave a completely insulated conductive film pattern and exposed feed-throughs so that the second level conductive pattern may be deposited atop the insulator to be interconnected to the first level by the feedthroughs.

Although the Feng et al invention has been successful, it nevertheless involves the prior art process of depositing the feedthrough atop the first level conductor. Because of this process, the feedthrough connections may exhibit poor mechanical strength and/or higher contact resistance, which results in poor manufacturing yields. It would be more desirable to form the via studs as integral parts of the metallurgy so as to eliminate the interface between the studs and the underlying metallurgy.

SUMMARY OF THE INVENTION

Accordingly, it is a primary object of our invention to form via studs which are integral parts of their associated conductive metallurgies.

It is another object of our invention to provide an improved process of forming interconnections between levels of metallurgy without the necessity of etching dielectric layers.

It is yet another object of our invention to provide improved techniques for reducing the area required for wiring patterns atop semiconductor chips and thereby improve the utilization of the semiconductor.

These and other objects of our invention are achieved by forming via studs in multilevel interconnection systems wherein the interface between the studs and the underlying metallurgy is eliminated.

The process involves blanket-depositing both the first thin film, typically metal, an etch barrier, as well as the via stud thin film, typically metal. This composite is then patterned by standard processes, preferably a lift-off process, and configured as the desired first-level conductive pattern. The via stud thin film alone is then patterned, preferably by reactive ion etching, using said etch barrier to prevent any etching of the first-level metal. This completes the formation of the studs.

Planar sputtered $SiO_2$ around the via studs is then deposited. The $SiO_2$ peaks formed on top of the via studs are preferentially etched, preferably by ion beam etching in an ion beam system, taking advantage of the differential etching due to the angular dependency of the ion beam.

This series of steps completes the basic process, which may be repeated for other levels of metallization.

In one preferred embodiment, the underlying metallurgy comprises aluminum, copper-doped aluminum, or copper-doped aluminum with silicon added. The etch barrier is preferably chrome, and the via studs are preferably formed from aluminum-copper.

DESCRIPTION OF THE PREFERRED EMBODIMENT

Although our invention is described principally in terms of the first and second levels of metallurgy, it will be understood that it applies to any such level or combination of levels atop a substrate.

Figure 1:
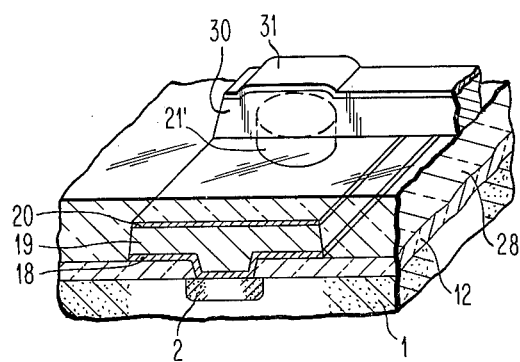
FIG. 1 is a partially sectioned, perspective view of a portion of an integrated circuit fabricated in accordance with our invention.

In FIG. 1 there is shown a first-level metal stripe 19 which is connected through a dielectric layer 12 to impurity region 2 in a semiconductor body 1. A layer 18 is disposed between film 19 and region 2. For example, if aluminum or aluminum doped with copper is used as thin film 19, then a layer of barrier material, such as chrome, is used to prevent the interaction of the aluminum with the contact metallurgy, which is typically platinum silicide (not shown).

Stripe 19 represents a portion of a complex conductive pattern atop chip 1 and is illustrated as being relatively elongated for connection to a second level of metallization 30, as well as to other stripes (not shown) on the first level. A feed-through, or via stud, 21' interconnects film 19 and film 30 through a dielectric layer 28 which is preferably sputtered SiO$_2$. Disposed atop and coextensive with layer 19 is layer 20 which has the function in the process as a barrier to the etching of layer 19 while stud 21' is being formed. A second etch barrier layer 31 is disposed atop layer 30. Typically, another via stud or a number of them (not illustrated) are disposed atop layer 31. The process for forming this type of interconnection is described in detail with respect to FIGS. 2A-2K.

As will be understood by those skilled in the semiconductor art, body (chip) 1 contains many thousands of impurity regions. The surface conductive patterns function both to interconnect these regions into circuits as well as to connect these circuits with external connections off-chip.

Figure 2A:
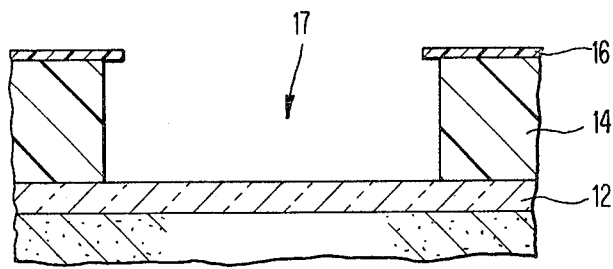
FIGS. 2A-2K are diagrammatic, cross-sectional views of a structure being fabricated in accordance with the preferred embodiments of our invention.
Figure 2B:
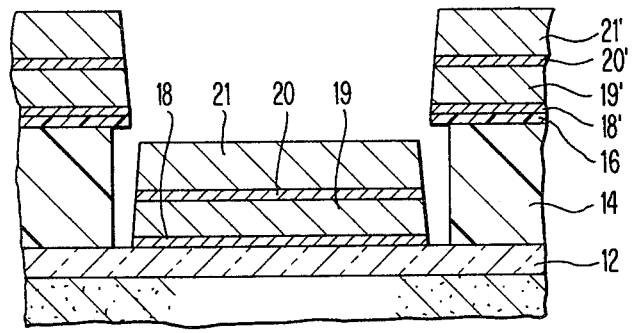

Turning now to the process, FIGS. 2A and 2B illustrate the preferred process for depositing thin film 19 in a desired first-level conductive portion atop layer 12. The preferred technique corresponds to that described in U.S. Pat. No. 4,004,044, which issued in the names of Franco et al, and is assigned to the same assignee as the present application. This process is illustrated in abbreviated form in FIGS. 2A and 2B and will be described below briefly. Alternate techniques for forming the metallurgy comprise standard wet or reactive ion (plasma) substractive etching processes which are well known to those of skill in the art. However, the lift-off technique described in the aforementioned patent is capable of providing superior definition of metallurgy, thereby minimizing the area required for wiring.

Turning now to FIG. 2A, the lift-off process commences with the blanket deposition of a thin layer of polyether sulfone (not shown) which facilitates the lift-off process. The use of polysulfone is a modification of the process described in the aforementioned patent to Franco et al and has been described in the article by Carr et al entitled "Stripping Promotor for Lift-Off Mask", IBM Technical Disclosure Bulletin, Volume 19, No. 4, Sept. 1976, p. 1226. Disposed atop the polysulfone layer is a layer 14 of an organic polymer material such as a novolak-resin-based positive resist which is baked to 210° C. to 230° C. to render it non-photosensitive. Atop layer 14 is coated a methylsiloxane resin barrier layer 16 followed by a layer of a radiation sensitive resist (not shown).

The resist layer is subjected to radiation and is developed in the standard manner to provide a patterned relief image. The resist mask is then used to permit selective removal of the underlying layers 14 and 16 to expose window 17 illustrated in FIG. 2A. It will be understood that there are thousands of such windows formed in a single layer atop a semiconductor chip. Window 17 is merely exemplary. The technique of forming the windows in layers 16 and 14 is described in great detail in the aforementioned Franco et al patent, and a further description here would be unnecessarily redundant.

After the windows 17 are formed, a layer 18 of chrome is blanket-deposited atop a substrate and the lift-off mask. For convenience in this discussion the portions of the layers which are deposited atop the resist masks 16 and 14 are illustrated by the primed numeral of the numeral used to illustrate the metal which remains atop the substrate after the lift-off process has been completed.

As previously noted, the chrome acts as a diffusion barrier betweem aluminum and silicon. The chrome is not necessary for the practice of our invention and forms no part of our invention, per se. Products can and have been manufactured successfully without the use of an interface between the aluminum and the silicon. In particular, an alloy of aluminum-copper which is doped with a small amount of silicon can be deposited successfully atop a substrate of silicon without deleterious effects. Moreover, chrome is not the only barrier material which may be used. For example, a composite layer of tantalum and chrome may be used. In addition, other metals such as titanium or tungsten or alloys thereof may also be used.

Returning now to FIG. 2B, a layer of metal 19, which is preferably aluminum-copper, is deposited atop the chrome, preferably in the same evaporation chamber. Layer 19 operates as the functional first level thin film metallurgy.

Following the deposition of the aluminum, another layer of chrome 20 is deposited to a preferred thickness of around 1,000Å. Layer 20 acts as an etch barrier to the etching of layer 19 in subsequent process steps. After the deposition of layer 20, another layer 21 is deposited. This layer is to function as the interconnection metallurgy or via stud connection. In our preferred process, layer 21 is also copper-doped aluminum.

In our preferred process, to assure good results the thickness of underlay resist layer 14 is approximately 1.5 times the thickness of all of the metal layers 18–21. Conventionally, the thicknesses of the metal layers are as follows: chrome layer 18: 1,000Å, aluminum-copper layer 19: around 8,500Å, chrome layer 20: 1,000Å, aluminum-copper layer 21: around 15,500Å.

Figure 2C:
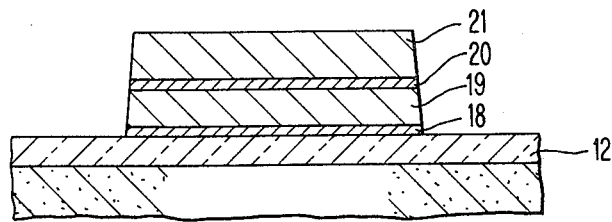

The remaining lift-off structure and overlying metal are quickly lifted off, using N-methylpyrrolidone or another suitable solvent to leave the patterned metal adherent to the surface of the semiconductor and the insulating layer 12, as shown in FIG. 2C.

Chrome is not the only etch barrier which may be used, although it is most convenient. For example, Ta, Ti, W and other metals or alloys thereof may be used with good results.

Figure 2D:
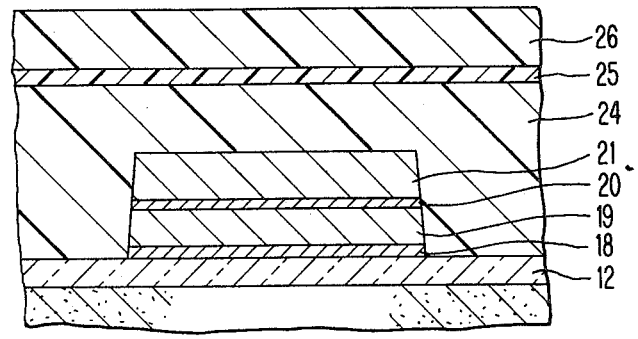
Figure 2E:
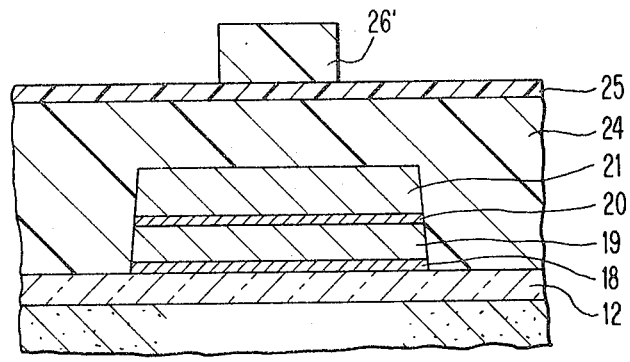
Figure 2F:
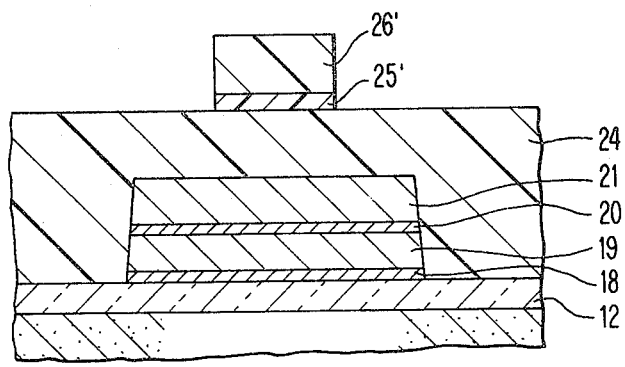

In the next series of steps illustrated in FIGS. 2D, 2E and 2F, a second lift-off photoresist mask process is utilized to define the via stud pattern which will be formed from layer 21, which is at this point coextensive with underlying first metal layer 19. It is noted at this point that the lift-off process here is utilized for pattern definition and not for the standard purpose of lifting off excess metal which had been blanket-deposited atop the resist.

Turning now to FIG. 2D, this masking process commences with the blanket deposition of an organic polymeric material 24 which is baked. Atop layer 24 is coated the methylsiloxane resin masking layer 25 followed by a layer 26 of a radiation-sensitive resist.

Layer 26 is exposed and developed to provide a patterned relief image which corresponds to the via stud pattern to be formed. The patterned resist is illustrated by the numeral 26' in FIG. 2E.

The exposed and patterned layer 26' is then used as a mask for the reactive ion etching of resin masking layer 25 as described in U.S. Pat. No. 4,004,044 to effectively transfer the openings of layer 26 to resin layer 25, as shown in FIG. 2F.

Figure 2G:
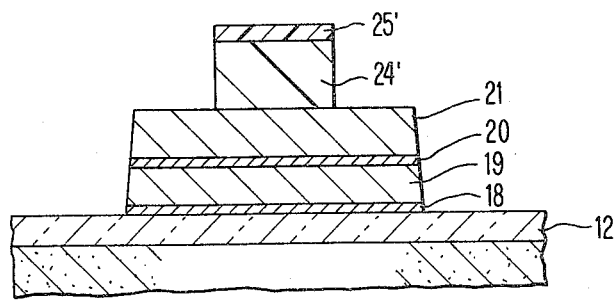

Next, using layer 25' as a mask the polymeric masking layer 24 is apertured by reactive ion etching in an oxygen gas ambient. If resist layer 26' has not been removed previously by a suitable solvent, the oxygen plasma serves to remove it. The resulting structure is shown in FIG. 2G where resist layer 24' and resin layer 25' together define the via studs to be formed in layer 21. Contrary to the desired structure in the usual lift-off process, no overhang is desired in layer 25' with respect to layer 24'.

Figure 2H:
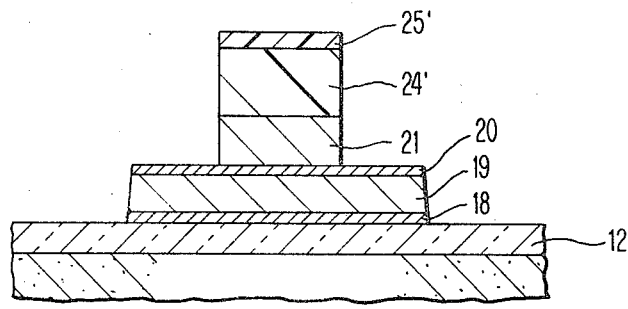

In the next step illustrated in FIG. 2H, via stud 21' is formed. The studs are formed in a commercial plasma or reactive ion etching chamber. With aluminum-copper used as the stud metallurgy, a gas mixture of Ar/Cl$_2$ or Ar/CCl$_4$ is used. Other suitable mixtures which do not attack SiO$_2$ or silicon nitride may also be used. The etch rate of aluminum-copper is approximately 1.7 to 2 times faster than photoresist layer 24'. The underlying layer 20 acts as an automatic etch stop because of the substantial differential etch rates between aluminum and chrome. The etch rate of aluminum-copper in the aforementioned gases is around 1,000Å per minute, whereas the etch rate of chrome is around 100Å per minute. After this step the remaining layers 24' and 25' are removed in the chamber using a mixture of CF$_4$ and O$_2$ which does not affect chrome layer 20; nor will it substantially affect aluminum-copper layer 21' disposed underneath resist layer 24'. Alternatively, resist layer 24' and 25' may be removed by immersion into a solvent, such as N-methylpyrrolidone and a photoresist solvent.

Figure 2I:
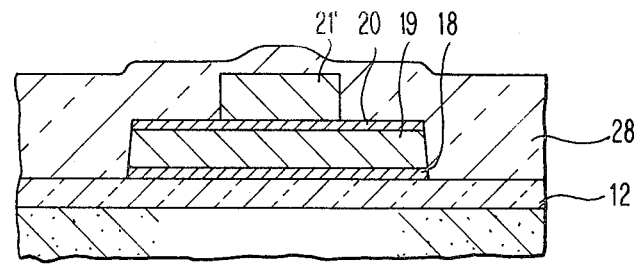
Figure 2J:
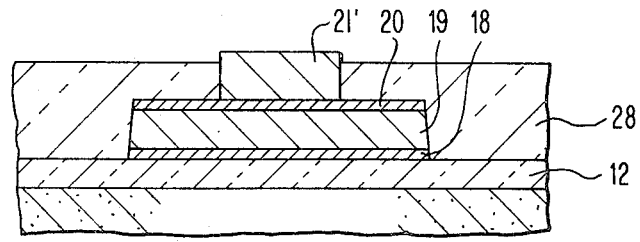
Figure 2K:
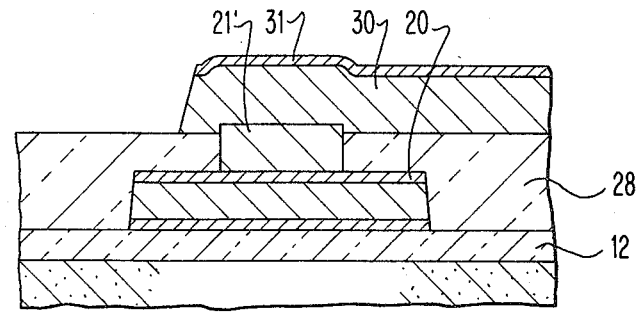

The exposed metallurgy is then covered with an insulating layer 28, as shown in FIG. 2I. The preferred technique for depositing layer 28 is by the driven or tuned anode RF deposition system, described, for example, in U.S. Pat. No. 3,804,738 in the names of Lechaton et al or U.S. Pat. No. 3,983,022 in the names of Auyang et al. Both of these patents are assigned to the same assignee as the present application.

The quartz peaks are then etched off and the upper surfaces of studs 21' are exposed.

It is preferable to utilize ion milling to remove the peaks atop the via studs preferentially. With the ion milling technique, typical conditions are an accelerating voltage of 1,000 volts with an angle of incidence of around 30°–60° and a rotating substrate. Another technique which may be used to form glass which is substantially planar around stud 21' is a blanket reactive ion etching of the SiO$_2$ in a system which is capable of isotropic etching. Such machines are commercially available from the IPC or LFE corporation. Neither of these techniques are our invention, per se.

After the planarization, studs 21' are exposed whereas the underlying metal layers 18, 19 and 20 remain covered by oxide layer 28.

The second level of metallization may now be deposited atop insulator 28 so as to contact the via studs 21'. As with the first level of metallization, the second level comprises the functional metal 30, as well as an etch barrier 31. Preferably layer 30 comprises aluminum-doped copper, and layer 31 comprises chrome. The second level metallization may be patterned using the lift-off process described previously with respect to FIGS. 2A–2C. Layer 33 disposed atop etch barrier 31 would then be patterned, as shown in FIGS. 2D–2I to form a stud which would interconnect the second level of metallization to the third level. The process can be continued for as many levels of metallization as are required.

Figure 3:
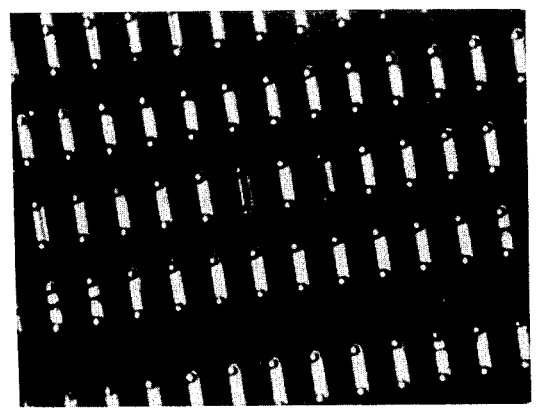
FIG. 3 is a photomicrograph taken of a semiconductor chip showing via studs atop a first-level metallurgy which are formed in accordance with our invention.

FIG. 3 is a photomicrograph illustrating via studs which we have actually formed on a semiconductor test site to demonstrate the invention. The entire test site comprised 2,000 first level metal tabs with two via studs in each tab. The mechanical strength of the studs was very high, and the contact resistance quite low.

Although our invention has been particularly shown and described with reference to the preferred embodiments thereof, it will be understood by those skilled in the art that the foregoing and other changes in form and details may be made therein without departing from the spirit and scope of the invention.

For example, we have described numerous alternative techniques for forming the patterned metallization atop the semiconductor substrate. We prefer to use the lift-off process disclosed by Franco et al in U.S. Pat. No. 4,004,044, but our invention is not limited to this. Other alternatives are available in U.S. Pat. Nos. 3,873,361 and 3,892,943. These patents describe lift-off processes which we could use in the operation of our invention.

In addition, we have described numerous metallurgies which could be used for the interconnections and the etch barriers. Also, there are a number of etching processes available to pattern the metal in the desired wiring configurations.

We claim:

1. A method for making a connective system for electrically connecting regions of a semiconductor substrate, the method comprising the steps of:

a. forming a patterned composite metal film at select regions of the substrate, the composite metal film being formed with a first metallic layer in contact with the substrate, a second metallic layer overlaying the first layer and a third metallic layer overlaying the second layer, the metal of the second layer having an etch rate substantially less than the etch rate of the third layer when reactive ion etched in a gas mixture including argon and chlorine;

b. forming a positive patterning composition reactive ion etch mask at select regions of the composite metal film, the composite mask including a first mask layer of Novolak-resin-based photoresist of predetermined thickness overlaying the composite metal film, a second masking layer of methylsiloxane resin of predetermined thickness overlaying the first masking layer and a third masking layer of radiation sensitive material overlaying the second masking layer;

c. patterning the composite etch mask by selectively exposing the third layer thereof to radiation in accordance with the pattern desired, developing the third layer, patterning the mask second layer with a reactive ion etch in a gas mixture including fluorine and oxygen in accordance with the pattern of the third layer; and thereafter patterning the mask first layer with a reactive ion etch of oxygen in accordance with the pattern of the second layer so that the second layer does not overhang the first layer;

d. patterning the third metallic layer of the composite metal film by reactive ion etching with a gas mixture including argon and chlorine so that the predetermined thickness of the etch mask second and third layer sustains a residual thickness after etch which is sufficient to assure formation of a metallic stud in the third layer substantially in conformity with the mask pattern, the second metallic layer of the metal film acting as an etch stop;

e. removing the residual composite reactive ion etch mask;

f. depositing a nonconducting film over the patterned composite metal film and the substrate; and g. etching the nonconductive film to expose at least a portion of the stud formed in the third layer of the composite metal film.

2. The method of claim 1 further including one or more successive repetitions of steps a to g to form multiple layers within the connective system.

3. The method of claim 2 wherein the metal of the first and third layers of the composite metal film are selected from the group comprising aluminum, aluminum-copper alloys and aluminum-copper-silicon alloys.

4. The method of claim 3 wherein the metal of the second layer of the composite metal film is selected from the group consisting of chromium, tantalum, titanium, tungsten and alloys thereof.

5. The method of claim 1 wherein the composite mask films first layer of Novolak-resin-based photoresist is baked at a temperature between 210° C. to 230° C. to render it non-photosensitive.

6. The method of claim 1 wherein the insulating layer is formed by depositing a layer of silicon dioxide.

7. The method of claim 6 wherein the silicon dioxide is deposited by r.f. sputtering.

8. The method of claim 5 wherein the residual thickness of the first and second mask layers remaining after patterning of the third metallic layer is removed by reactive ion etching with a gas mixture including fluorine and oxygen.

9. The method of claim 5 wherein the residual thickness of the first and second mask layers remaining after patterning of the third metallic layer is removed by immersion in a solution including N-methylpyrrolidone and a photoresist solvent.

* * * * *